United States Patent
Lee

(10) Patent No.: US 10,305,284 B2
(45) Date of Patent: May 28, 2019

(54) APPARATUS AND METHOD OF MEASURING DATA IN HIGH VOLTAGE DIRECT CURRENT SYSTEM

(71) Applicant: LSIS CO., LTD., Anyang-si, Gyeonggi-do (KR)

(72) Inventor: Eun Jae Lee, Seoul (KR)

(73) Assignee: LSIS CO., LTD., Anyang-si, Gyeonggi-do (KR)

( * ) Notice: Subject to any disclaimer, the term of this patent is extended or adjusted under 35 U.S.C. 154(b) by 406 days.

(21) Appl. No.: 15/066,228

(22) Filed: Mar. 10, 2016

(65) Prior Publication Data

US 2017/0063091 A1 Mar. 2, 2017

(30) Foreign Application Priority Data

Aug. 27, 2015 (KR) ........................ 10-2015-0121142

(51) Int. Cl.
*G01R 21/133* (2006.01)
*H02J 3/36* (2006.01)
*H02M 5/40* (2006.01)

(52) U.S. Cl.
CPC ............. *H02J 3/36* (2013.01); *G01R 21/1333* (2013.01); *H02M 5/40* (2013.01); *Y02E 60/60* (2013.01)

(58) Field of Classification Search
CPC .......... H02J 3/36; G01R 21/1333; H02M 5/40
USPC ....................................................... 700/286
See application file for complete search history.

(56) References Cited

U.S. PATENT DOCUMENTS

| 2004/0199478 A1* | 10/2004 | Arita ...................... G06Q 50/06 705/412 |
| 2011/0093124 A1* | 4/2011 | Berggren ................. H02J 3/06 700/286 |
| 2011/0130982 A1* | 6/2011 | Haag ..................... G01R 22/063 702/62 |
| 2012/0200166 A1* | 8/2012 | Berggren ................. H02J 3/24 307/102 |
| 2014/0327448 A1 | 11/2014 | Kim et al. |

FOREIGN PATENT DOCUMENTS

| CN | 102474100 A | 5/2012 | |
| EP | 2312719 | 4/2011 | |
| EP | 2312719 A1 | 4/2011 | |
| EP | 2312719 B1 * | 8/2012 | ............... H02J 3/06 |
| EP | 2462673 B1 * | 3/2016 | ............... H02J 3/24 |

(Continued)

OTHER PUBLICATIONS

European Patent Office Application Serial No. 16159979.0, Search Report dated Jan. 30, 2017, 7 pages.

(Continued)

*Primary Examiner* — Mohammad Ali
*Assistant Examiner* — Joshua T Sanders
(74) *Attorney, Agent, or Firm* — K&L Gates LLP

(57) ABSTRACT

A data measurement device in a high voltage direct current (HVDC) system is provided. The data measurement device includes: a power measurement unit measuring pieces of power related data; and a control unit determining measurement times at which the pieces of power related data are measured respectively, and performing control based on pieces of power related data having a same measurement time among the pieces of power related data.

10 Claims, 8 Drawing Sheets

(56) References Cited

FOREIGN PATENT DOCUMENTS

| | | |
|---|---|---|
| JP | 1996-228480 | 9/1996 |
| JP | 1997-200957 | 7/1997 |
| JP | H1127865 | 1/1999 |
| JP | 2003158824 | 5/2003 |
| JP | 2008209995 | 9/2008 |
| JP | 2009-217762 | 9/2009 |
| JP | 2015-024136 | 2/2015 |
| JP | 2015-109440 | 6/2015 |
| KR | 101171027 B1 | 8/2012 |
| KR | 10-1367467 | 2/2014 |
| KR | 10-2014-0113989 | 9/2014 |
| KR | 10-2014-0036552 | 2/2015 |
| WO | 2011015247 | 2/2011 |

OTHER PUBLICATIONS

Japan Patent Office Application No. 2016-076534, Office Action dated Feb. 28, 2017, 3 pages.
Chen, et al.; "Time Stamping Based on Delay Measurement in Sensor Networks"; Computer engineering & Science, vol. 30 No. 2; 2008; (4 pages).
Chinese Office Action for related Chinese Application No. 201610222077.2; action dated Aug. 3, 2018; (7 pages).

\* cited by examiner (Prior Art)

FIG. 6

| ITEM no. | MEASUREMENT DATA TYPE | MEASUREMENT VALUE | MEASUREMENT TIME | DATA CONVERSION COMPLETION TIME | CYCLICAL SIGNAL | STATE CHANGE SIGNAL |
|---|---|---|---|---|---|---|
| 1 | AC VOLTAGE | 20 | 11:25:20 | 11:25:21 | | yes |
| 2 | AC CURRENT | 30 | 12:25:20 | 12:25:22 | | yes |
| 3 | AC VOLTAGE | 12.5 | 13:25:20 | 13:25:23 | | yes |
| 4 | DC VOLTAGE | 56 | 14:25:20 | 14:25:24 | | yes |
| 5 | DC CURRENT | 75 | 15:25:20 | 15:25:25 | | yes |
| 6 | CIRCUIT BREAKER STATE | ON | 16:25:20 | 16:25:22 | yes | |
| 7 | TAP Position | 7 | 16:25:20 | 16:25:25 | yes | |
| 8 | CIRCUIT BREAKER STATE | ON | 16:25:30 | 16:25:33 | yes | |
| 9 | TAP Position | 8 | 17:26:20 | 17:26:23 | | yes |
| 10 | | | | | | |
| 11 | | | | | | |
| 12 | | | | | | |
| 13 | | | | | | |
| 14 | | | | | | |
| 15 | | | | | | |

| DATA | SENSING TIME | Value |
|---|---|---|
| CURRENT | 1:00:00 | 100 |
| CURRENT | 1:00:05 | 101 |
| CURRENT | 1:00:10 | 103 |  ~701
| CURRENT | 1:00:20 | 107 |
| CURRENT | 1:00:25 | 99 |
| CURRENT | 1:00:30 | 96 |

| DATA | SENSING TIME | Value |
|---|---|---|
| CIRCUIT BREAKER STATE | 1:00:00 | ON |
| CIRCUIT BREAKER STATE | 1:00:10 | ON |  ~702
| CIRCUIT BREAKER STATE | 1:00:20 | ON |
| CIRCUIT BREAKER STATE | 1:00:30 | OFF |
| CIRCUIT BREAKER STATE | 1:00:40 | ON |
| CIRCUIT BREAKER STATE | 1:00:50 | ON |

| DATA | SENSING TIME | Value |
|---|---|---|
| OIL TEMPERATURE | 1:00:00 | 300 |
| OIL TEMPERATURE | 1:00:02 | 301 |
| OIL TEMPERATURE | 1:00:04 | 310 |
| OIL TEMPERATURE | 1:00:06 | 315 |
| OIL TEMPERATURE | 1:00:08 | 320 |
| OIL TEMPERATURE | 1:00:10 | 322 |  ~703

| DATA | SENSING TIME | Value |
|---|---|---|
| VOLTAGE | 1:00:00 | 200 |
| VOLTAGE | 1:00:10 | 199 |  ~704
| VOLTAGE | 1:00:20 | 199 |
| VOLTAGE | 1:00:30 | 199 |
| VOLTAGE | 1:00:40 | 210 |
| VOLTAGE | 1:00:50 | 199 |

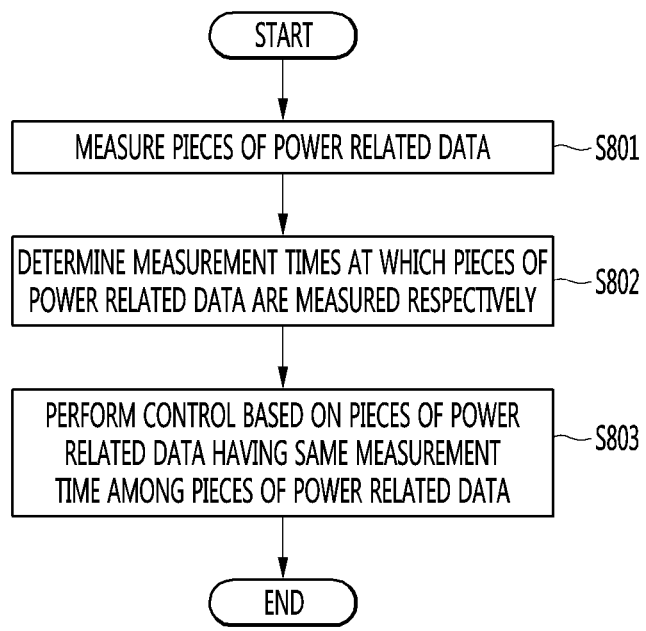

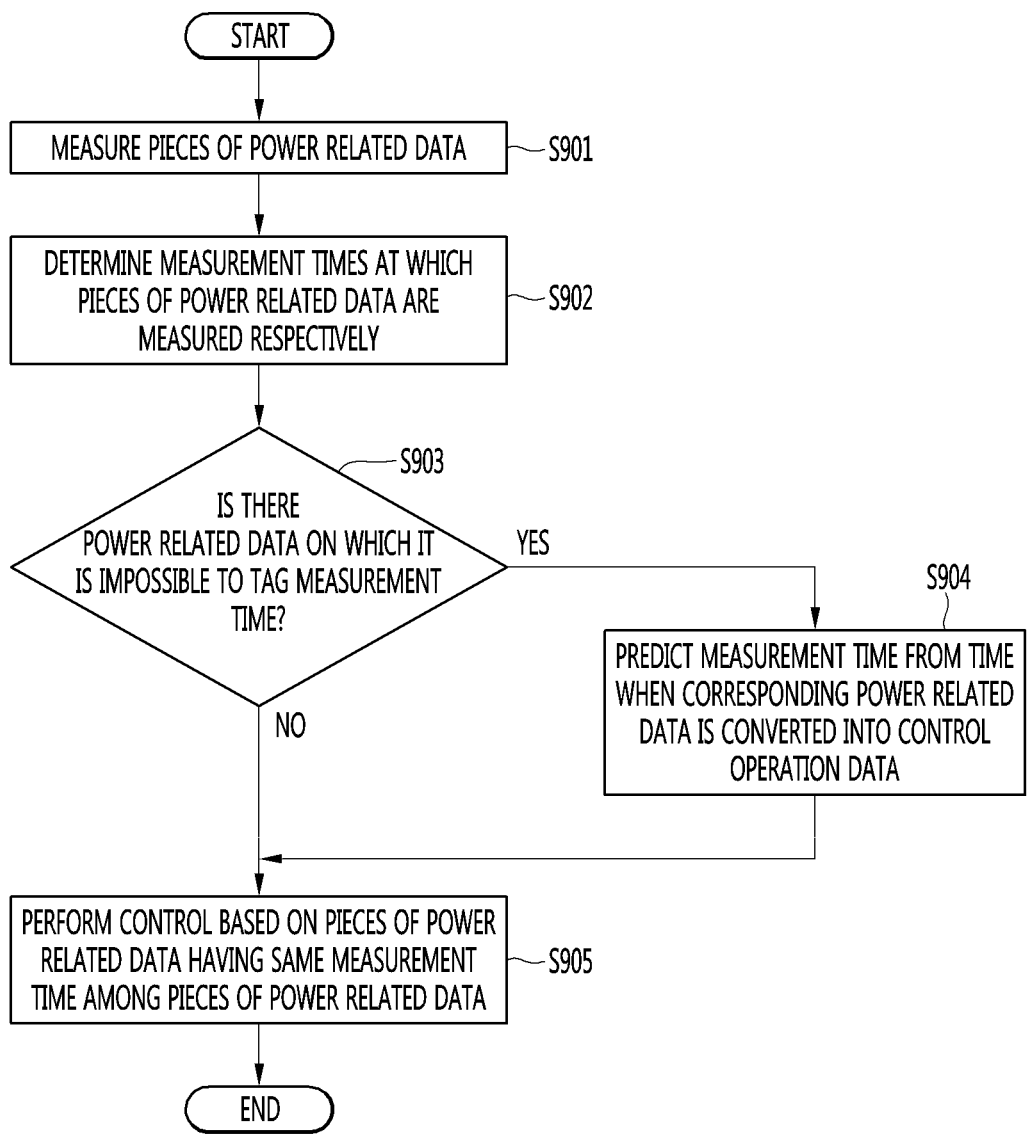

APPARATUS AND METHOD OF MEASURING DATA IN HIGH VOLTAGE DIRECT CURRENT SYSTEM

CROSS-REFERENCE TO RELATED APPLICATIONS

Pursuant to 35 U.S.C. § 119(a), this application claims the benefit of earlier filing date and right of priority to Korean Patent Application No. 10-2015-0121142, filed on Aug. 27, 2015, the contents of which are all hereby incorporated by reference herein in its entirety.

BACKGROUND

The present disclosure relates to an apparatus and method of measuring data in a high voltage direct current (HVDC) system, and more particularly, to an apparatus and method of measuring data in a high voltage direct current (HVDC) system that marks time information with sensor or meter data in order to reduce an error that occurs because a data acquisition time at each sensor or meter is different from each other, to maintain the accuracy of control.

In recent, a demand for high voltage direct current (HVDC) is soaring due to an increase in a large offshore wind farm and smart grid establishment.

The HVDC is a technique that enables a high-voltage alternating current (AC) generated by a power station to be converted and transmitted into a DC by using a power converter and then re-converted into an AC at a power receiving point for power supply.

Such an HVDC transmission technique may stably transmit power over long distances because there is little power loss, insulation is easy due to a relatively low voltage compared to an AC, and there is little induced obstacle, thus the transmission technique enables efficient, economical power transmission and may overcome the drawbacks of AC power transmission.

FIG. 1 schematically shows an HVDC transmission technique.

Referring to FIG. 1, an HVDC system 100 is installed between an AC network A (hereinafter, referred to as "system A") (110) and an AC network B (hereinafter, referred to as "system B") (120) to link the two systems 110 and 120.

The HVDC system 100 converts and transmits AC power received from any one 110 or 120 of the two systems 110 and 120 into DC power, and a power receiving point that has received the DC power re-converts the DC power into the AC power to transmit the AC power to the other system 110 or 120.

In particular, the HVDC system 100 may convert and transmit the AC power received from the system A 110 into DC power and a power receiving point that has received the DC power may re-convert the DC power into the AC power to transmit the AC power to the system B 120, or the HVDC system may convert and transmit the AC power received from the system B 120 into DC power and a power receiving point that has received the DC power may re-convert the DC power into the AC power to transmit the AC power to the system A 110.

Each of the system A 110 and the system B 120 may transmit AC power to the HVDC system 100 or receive AC power from the HVDC system 100.

In this example, the system A 110 and the system B 120 may be AC power systems in the same country or be AC power systems that use the same frequency. However, they may also be AC power systems that are used in different countries or use different frequencies, according to an embodiment. In this case, the HVDC system 100 enables a link between countries or between AC power systems that use different frequencies.

FIG. 2 shows the flow of measurement data in a typical HVDC system.

An AC and DC measurement device 210 measures AC data and DC data. To this end, the AC and DC measurement device 210 may include at least one current transformer (CT) and potential transformer (PT) that measure AC data and DC data.

The AC CT senses the current of an AC bus at which the AC CT is installed, to measure the AC current. The AC PT measures an AC voltage. Also, a DC CT, a DC voltage divider (VD) for measuring the current and voltage of a DC are installed to measure analog state values. In this case, the DC CT measures the DC current and the DC VD measures the DC voltage.

A substation automation system (SAS) 220 obtains operation information on a facility rapidly and accurately. The SAS 220 classifies the above-described measurement data into AC and DC related information, analog information, and digital information to transmit the measurement data to an upper control system 240 through a remote terminal unit (RTU) to be described below.

The RTU 230 receives data classified by the SAS 220 and transmits it to the upper control system 240.

The upper control system 240 may be a supervisory control and data acquisition (SCADA) or an energy management system (EMS). The upper control system 240 manages and controls a system through state estimation, power system power flow analysis and credible accident simulation based on the received data.

In order to perform control needed for power system operation, an input data based operation is needed. In this case, although input data used for an operation is used on the assumption that it has been simultaneously measured, it is actually difficult to secure the synchronism of all measurement data.

It is because time synchronization is not made by many kinds of differences that occur in the process that data measured by using a passive sensing device is transmitted to an operation unit. In particular, the differences include a difference in transmission speed due to a difference in distance between a sensing device and a control unit, a time delay according to the device characteristic of each sensor, and a difference in time that is consumed to convert analog data into digital data that may be used for a control operation.

FIG. 3 is a diagram for explaining that the measurement time of data in a typical HVDC system has asynchronism.

It is assumed that the HVDC system performs a control operation based on four types of analog information obtained in FIG. 3, i.e., an AC current 310, a DC current 320, an AC voltage 330, and a DC voltage 340.

A control operation time is a time when an operation for control is performed. In FIG. 3, the HVDC system performs an operation at time A indicated by a dotted line. In the case where the operation is performed at the time A, the HVDC system would perform the control operation based on the four types of analog information obtained at the time A.

In this case, the measurement time of each of the four types of analog information used for the operation is shown by an arrow. Referring to FIG. 3, times corresponding to arrows in the AC current 310, the DC current 320, the AC voltage 330, and the DC voltage 340 are different from each other.

That is, although the HVDC system performs a control operation based on the four types of analog information obtained at corresponding times at the control operation time A, the respective measurement times of the analog information that the HVDC system has obtained at the time A are different from each other. That is, the respective measurement times of the four types of analog information are not synchronized.

As described earlier, it results from the difference in transmission speed due to the difference in distance between the sensing device and the control unit, the time delay according to the device characteristic of each sensor, and the difference in time that is consumed to convert the analog data into the digital data that may be used for the control operation.

Thus, in the case where the operation is performed by using pieces of data having asynchronous measurement times, the final control operation result may have an error because the respective measurement times of data are different from each other and due to the resulting difference and error in the AC current, the DC current, the AC voltage.

As such, pieces of data obtained at a time when the system performs the operation have a difference in measurement time between pieces of obtained data, and thus in the case where the operation is performed, an error occurs and thus the accuracy of control decreases, and further, control for second and third correction should be accompanied. In this case, a control target value does not converge and continues to vibrate and in the worst situation, the value may diverge.

SUMMARY

Embodiments provide a data measurement device and data measurement method in an HVDC system that may tag the data acquisition time of a sensor along with a measurement value and perform an operation based on the measurement value with which the data acquisition time is tagged, to perform control by using data acquired at the same time if possible, in order to decrease an error occurring due to differences in respective measurement times of pieces of data obtained for a control operation at the same time to maintain the accuracy of control.

Technical tasks to be achieved in the present disclosure are not limited to the above-mentioned technical tasks, and other technical tasks not mentioned could be clearly understood by a person skilled in the art to which embodiments proposed by the following descriptions pertain.

In one embodiment, a data measurement device in a high voltage direct current (HVDC) system includes: a power measurement unit measuring pieces of power related data; and a control unit determining measurement times at which the pieces of power related data are measured respectively, and performing control based on pieces of power related data having a same measurement time among the pieces of power related data.

In another embodiment, a data measurement method in a high voltage direct current (HVDC) system includes: measuring pieces of power related data; determining measurement times at which the pieces of power related data are measured respectively; and performing control based on pieces of power related data having a same measurement time among the pieces of power related data.

The details of one or more embodiments are set forth in the accompanying drawings and the description below.

Other features will be apparent from the description and drawings, and from the claims.

BRIEF DESCRIPTION OF THE DRAWINGS

FIG. 6 shows a DB that a data measurement device in an HVDC system according to an embodiment stores.

FIG. 7 is a diagram for explaining a control operation that a data measurement device in an HVDC system according to an embodiment performs.

FIG. 8 shows a data measurement method in an HVDC system according to an embodiment.

FIG. 9 shows a data measurement method in an HVDC system according to another embodiment.

DETAILED DESCRIPTION OF THE EMBODIMENTS

In the following, particular embodiments are described in detail with reference to the accompanying drawings. However, the technical spirit of the present disclosure is not limited by embodiments to be described below, and it is possible to easily propose regressive inventions or other embodiments that are included in the scope of the technical spirit of the present disclosure by the addition, change and deletion of other components.

The terms used herein are general terms widely used in relation to the corresponding technology if possible but in special cases, the applicant has arbitrarily selected terms, in which case their meanings are described in detail when describing the corresponding invention. Therefore, it is noted that the present disclosure should be understood with the meaning of a term, not the name of the term. In the following description, the term 'including' does not exclude the presence of other components or steps that are different from those enumerated.

Figure 1:
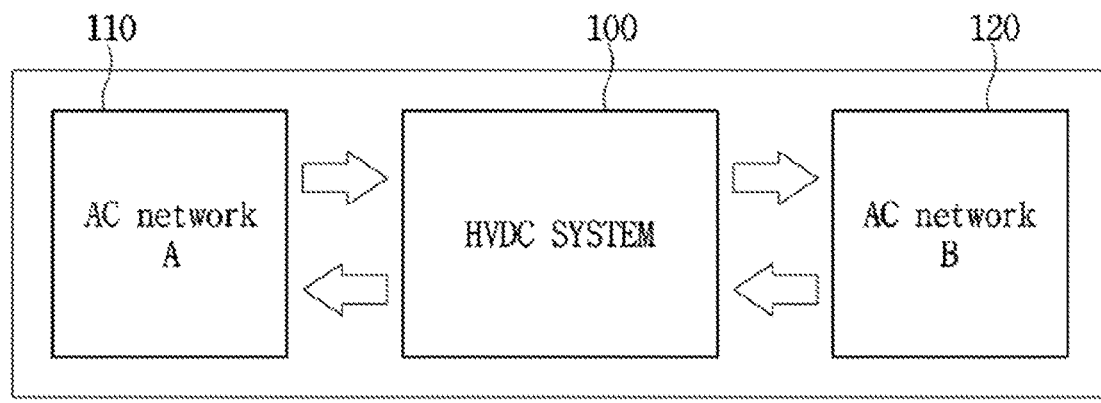
FIG. 1 schematically shows an HVDC transmission technique.
Figure 2:
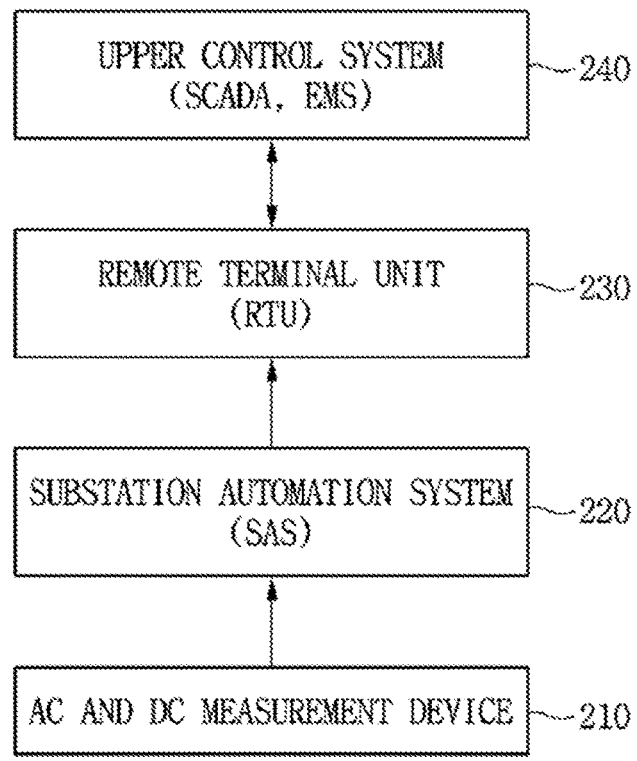
FIG. 2 shows the flow of measurement data in a typical HVDC system.
Figure 3:
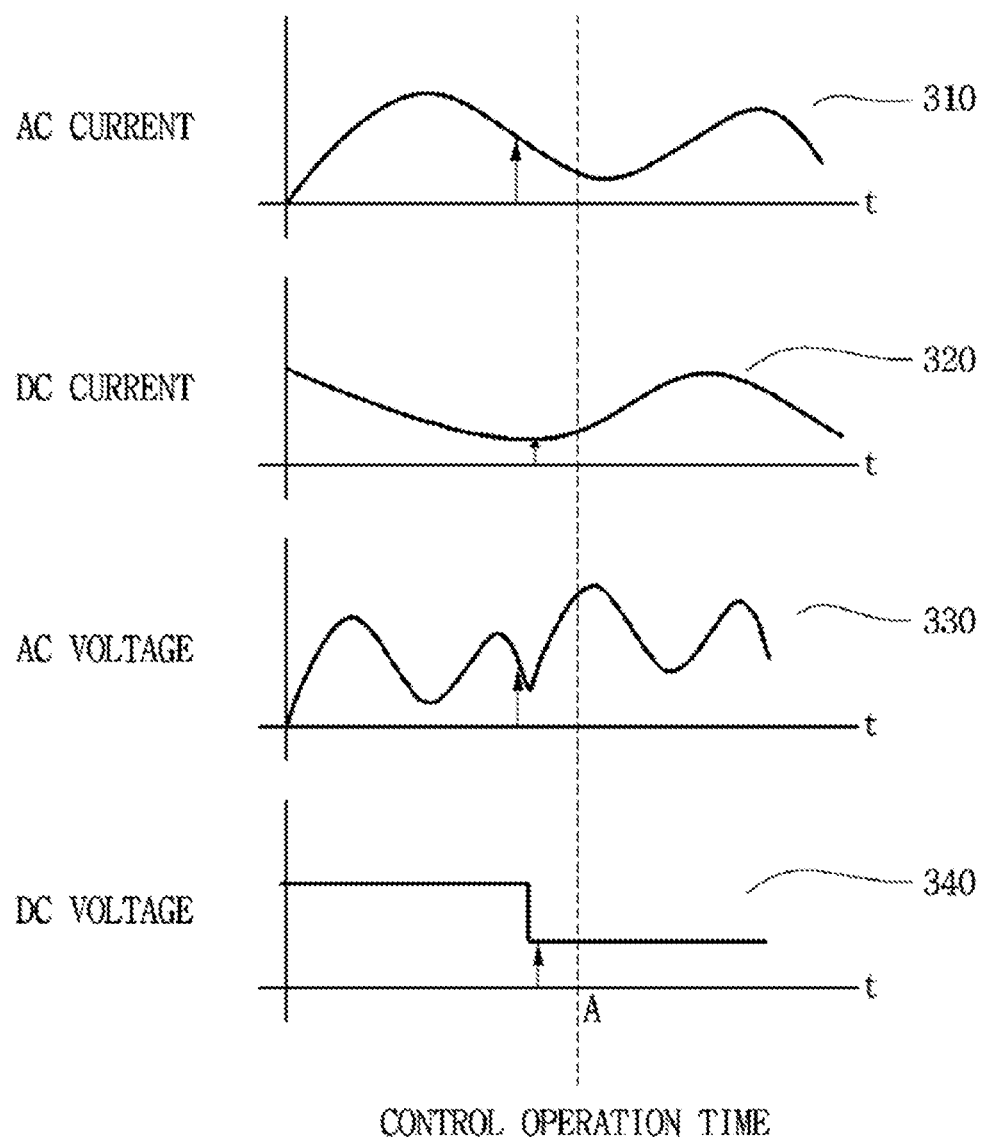
FIG. 3 is a diagram for explaining that the measurement time of data in a typical HVDC system has asynchronism.
Figure 4:
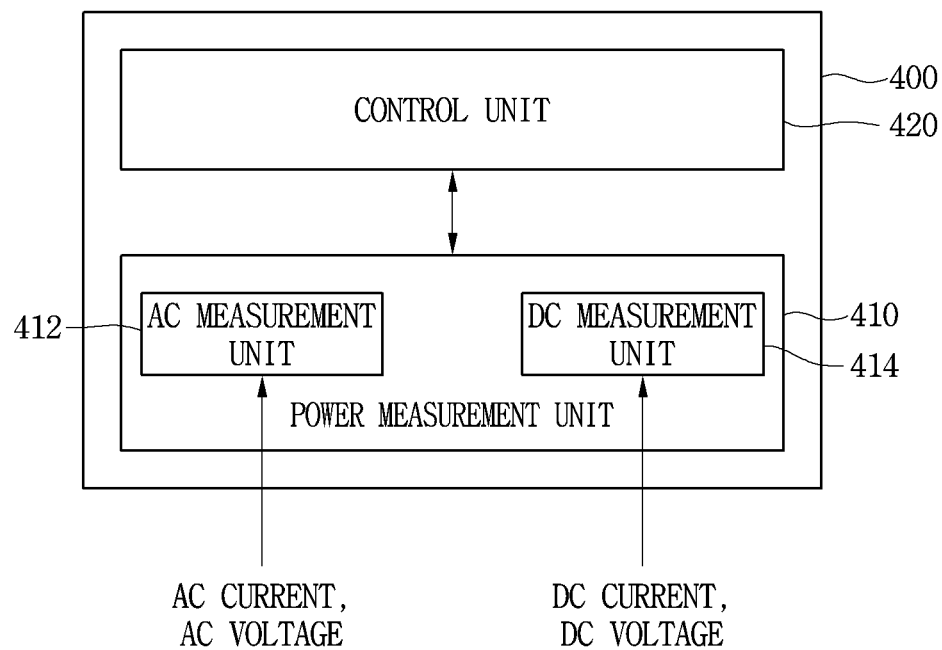
FIG. 4 shows the configuration of a data measurement device in an HVDC system according to an embodiment.

FIG. 4 shows the configuration of a data measurement device in an HVDC system according to an embodiment.

A data measurement device 400 in an HVDC system according to an embodiment may be used for an HVDC system (not shown), in which case it measures power related data for the control of the HVDC system (not shown). However, the embodiment is not limited thereto and the data measurement device 400 may be used for all types of operation and control systems that include an automation system, such as a substation automation system (SAS) and a supervisory control and data acquisition (SCADA) that may use data with which time information is tagged, and a wide upper monitoring control system, such as an energy management system (EMS) that is associated with many systems.

Further, the data management device 400 may be used for the operation and control of a system in which a data value represents a quick change, such as the TAP adjustment of a transformer.

The data measurement device 400 in the HVDC system according to the embodiment may include a power measurement unit 410 and a control unit 420.

The power measurement unit 410 measures pieces of power related data.

The power related data is data related to power that the HVDC system (not shown) controls, and may include information on a measurement data type, a measurement value, a measurement time, a data conversion completion time, whether it is a cyclical signal, and whether there is a state change signal. Related descriptions are provided in FIG. 6.

Also, the power measurement unit 410 may include a contact sensor to measure digital state values, such as the on/off state of a switch, the temperature of transformer oil, and a TAP position.

According to an embodiment, the pieces of power related data may include measurement values for an AC current, an AC voltage, a DC current, and a DC voltage.

To this end, the power measurement unit 410 may include an AC measurement unit 412 that measures AC power including the AC current and the AC voltage, and a DC measurement unit 414 that measures DC power including the DC current and the DC voltage.

In this case, the AC measurement unit 412 may be a sensor, such as an AC power management unit (PMU) and an AC intelligent electric device (IED), and the DC measurement unit 414 may be a sensor, such as a DC PMU and a DC IED.

However, the embodiment is not limited thereto and the power measurement unit 410 may include various types of or a number of sensors for sensing a current or a voltage according to the size and type of the HVDC system (not shown) or other operation and control systems (not shown).

The control unit 420 is connected to the power measurement unit 410 or performs communication to enable the power measurement unit 410 to measure pieces of power related data, and receives information on the pieces of power related data that are measured by the power measurement unit 410.

The control unit 420 determines a measurement time at which each of the pieces of power related data is measured, and performs control based on some pieces of power related data having the same measurement times among the pieces of power related data.

In this case, the control performed by the control unit 420 may include all types of control based on pieces of power related data. In particular, the control unit 420 may control the operation of a switching device including a circuit breaker based on pieces of power related data, perform power control increasing or decreasing an amount of transmission power, or perform the function of controlling the DC voltage and the AC voltage.

According to the embodiment, the control unit 420 is included in the data measurement device in the HVDC system but according to another embodiment, the control unit 420 may also be implemented outside the data measurement device. In this case, the control unit 420 may be implemented in the form of a controller in the HVDC system and generally control the HVDC system, including the control of the data measurement device.

According to an embodiment, the control unit 420 may classify pieces of power related data having the same measurement time into AC or DC related data and analog or digital data to transmit them to the upper control system of the data measurement device 400.

The SCADA (not shown) and the EMS (not shown) that correspond to the upper control system of the HVDC system (not shown) may manage and control a power system through state estimation, power system power flow analysis and credible accident simulation based on the received data.

The control unit 420 may enable the power measurement unit 410 to mark time information with pieces of measured power related data. The time information may be various types of information related to a measurement time, such as a data measurement time and a time of conversion into control operation data.

In particular, the control unit 420 enables measurement values, such as ON/OFF, a current, a voltage, and a flow that are measured by main facilities in the HVDC system (not shown), to be tagged with time information to facilitate the control of a converter station and use by the upper control system.

According to an embodiment, the control unit 420 may control the power measurement unit 410 to tag information on a measurement time to each of pieces of power related data.

According to another embodiment, the control unit 420 may control the power measurement unit 410 to obtain pieces of power related data to which time information is tagged, from a sensor or measurement device.

Figure 5:
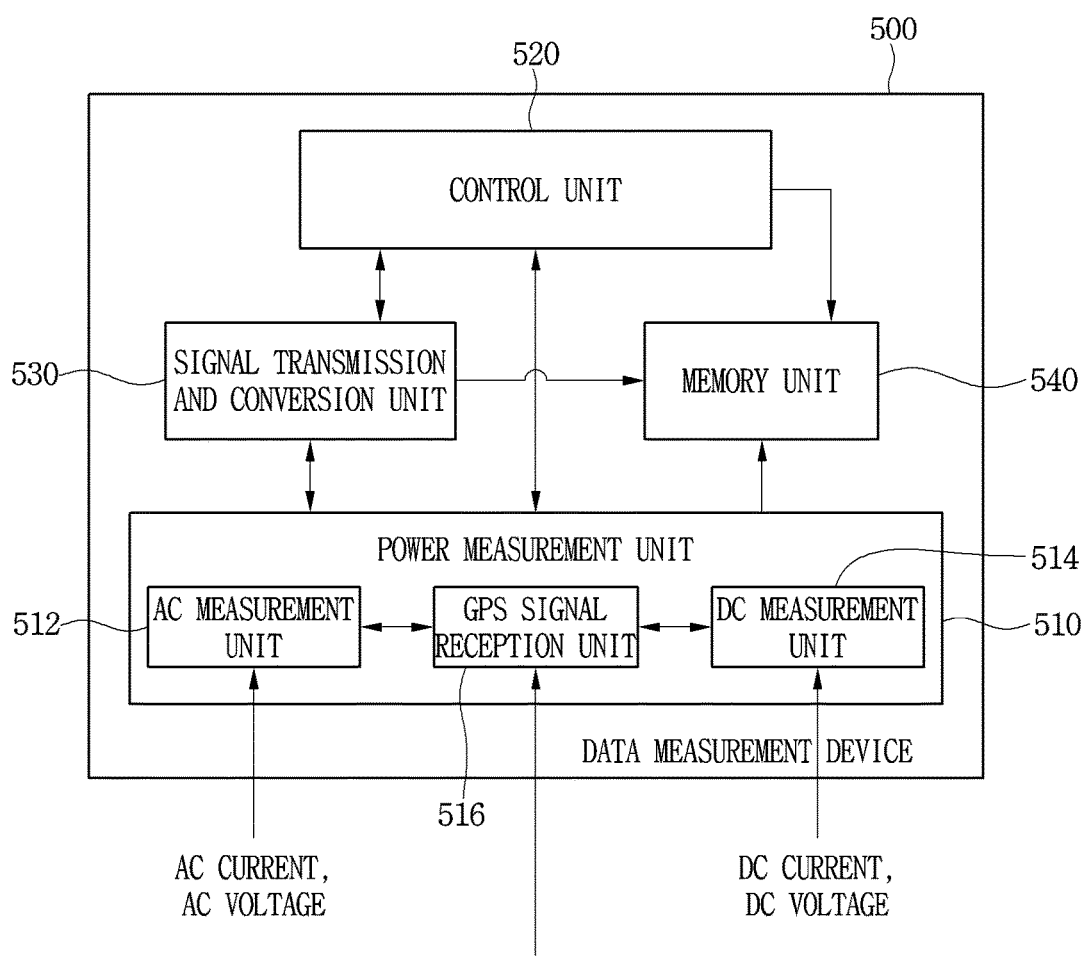
FIG. 5 shows the configuration of a data measurement device in an HVDC system according to another embodiment.

FIG. 5 shows the configuration of a data measurement device in an HVDC system according to another embodiment.

A data measurement device 500 in an HVDC system (not shown) according to another embodiment may include a power measurement unit 510, a control unit 520, a signal transmission and conversion unit 530, and a memory unit 540.

The power measurement unit 510 and the control unit 520 are similar to the configurations and operations of the power measurement unit 410 and the control unit 420 that have been described earlier FIG. 4. Thus, repetitious descriptions are omitted and only configurations and operations different from the above descriptions are described.

The power measurement unit 510 may include an AC measurement unit 512 and a DC measurement unit 514.

The AC measurement unit 512 may measure AC power that includes an AC current and an AC voltage. The DC measurement unit 514 may measure DC power that includes an DC current and an DC voltage. In this case, the AC measurement unit 512 and the DC measurement unit 514 may be an active sensor and/or a passive sensor.

Whether they are the active sensor or the passive sensor is identified by the operation type of a sensor.

In the case of the active sensor, the sensor applies certain processes (i.e., a voltage, a current, and thermal stimulus or other energy) to a measurement target upon measurement, and a certain amount of response or energy that occurs at this time is detected, to act as a sensor.

In the case of the passive sensor, the sensor senses a physical signal or energy that occurs from a measurement target.

Since the active sensor may apply certain processes that may measure a measurement time, to a measurement target to find the measurement time, it is possible to tag time information to pieces of power related data.

However, since the passive sensor only senses a current or voltage value that occurs from a measurement target, it is possible to know only an acquisition time, not an actual measurement time and thus it is difficult to tag measurement time information to pieces of measured power related data. Thus, the passive sensor predicts the actual measurement time from a time at which conversion into control operation data is completed. In particular, it is possible to predict the actual measurement time by the subtracting of a previously measured time consumed for signal transmission and conversion from the time at which the conversion into a control operation data is completed. In this case, the time consumed for the signal transmission and conversion is based on the value specified on the specification of the passive sensor and a conversion device, and in the case where there is no description on the specification, it is possible to calculate the time based on the characteristic test result of the sensor and device.

The power measurement unit 510 may further include a global positioning system (GPS) signal reception unit 516 that receives a GPS signal, and determine a measurement time based on the GPS signal received by the GPS signal reception unit 516. In this case, the GPS signal reception unit 516 may be connected to a GPS signal line that receives information from artificial satellite and distributes the information to a plurality of devices or systems.

When it is difficult to determine the respective measurement times of pieces of power related data, the control unit 520 may predict the measurement time from the time at which conversion into control operation data is completed. In this case, an actual measurement time may be calculated by the reflecting of signal processing and signal transmission times, a device characteristic, or the like.

For example, in the case where the AC measurement unit 512 or the DC measurement unit 514 that the power measurement unit 510 includes is the passive sensor, it is difficult to tag the measurement time information to the pieces of power related data that are measured as described earlier. In this case, the control unit 520 predicts the actual measurement time from a time at which conversion into control operation data is completed.

The signal transmission and conversion unit 530 converts pieces of power related data to control operation data for performing control and transmits the control operation data to the control unit 520.

The memory unit 540 stores pieces of power related data in association with respective actual measurement times. The memory unit 540 may be implemented in all types of storage devices that may read and write data, such as a random access memory (RAM), a synchronous dynamic ram (SDRAM), and the like.

FIG. 6 shows a DB that a data measurement device in an HVDC system according to an embodiment stores.

Data to which time information obtained from a sensor or a measurement device is tagged, or pieces of power related data that the power measurement units 410 and 510 obtain from the sensor or the measurement device and tag information on a measurement time may be stored in the DB in FIG. 6.

The data acquired by the power measurement units 410 and 510 is stored in the DB in FIG. 6. The DB includes pieces of power related data to which time information tagged, and may be stored in the memory unit 540 as described earlier in FIG. 5.

A measurement data type 610 relates to a data type, and may be information, such as an AC voltage, an AC current, a DC voltage, a DC current, a TAP position, and a circuit breaker state.

The circuit breaker state represents information on how a circuit breaker operates. That is, it provides information on whether the circuit breaker is in an open state or a closed state or whether the circuit breaker is in a trip state by an accident or control signal.

The TAP position represents information on in which state (step) a TAP device is currently. The TAP device is a device that is implemented for voltage adjustment due to variations in the primary voltage and secondary voltage of a transformer.

A measurement value 620 is a value that is obtained by the measuring of the measurement data type.

A measurement time 630 is a time at which the measurement data type 610 is measured.

A data conversion completion time 640 is a time at which conversion is completed in the case where the measurement data type is converted into control operation data for control.

A cyclical signal 650 is a matter that represents whether the measurement data type is regularly repeated.

A state change signal 660 is a matter that represents whether there is conversion into another state or a change in the current state.

Referring to FIG. 6, the data stored in item No. 5 is information on the DC current and the measurement value of a corresponding DC current is 75. In this case, the measurement value is measured at 15:25:20 and has been converted into control operation data at 15:25:25. The DC current does not correspond to the cyclical signal but corresponds to the state change signal.

In this case, the measurement time 15:25:20 may be an actual measurement time or an estimated value that is predicted from a time at which conversion into the control operation data is completed, as described earlier.

In the embodiment, data used as an input in a control operation may be primarily selected based on a measurement time. Measurement values are acquired from sensors, such as the AC PMU, the AC IED, and the DC IED as described earlier.

Since the measurement data acquired from the passive sensor may not include data on the measurement data, only a data conversion completion time may be marked. Thus, the control units 420 and 520 predict and record a predicted measurement time by the reflecting of a signal transmission time and a device characteristic that the signal transmission and conversion unit 530 obtains through system engineering and a test, and enables the control units 420 and 520 to use for data selection.

FIG. 7 is a diagram for explaining a control operation that a data measurement device in an HVDC system according to an embodiment performs.

In FIG. 7, the upper left table shows data measured by a current sensor. In the table, a data column represents that a measured data type is current data, a sensing time column represents a time at which the current data is measured, and a value column represents the measurement value of a current at a corresponding measurement time. In this case, referring to a fourth row 701, the current value measured at 1:00:10 is 103.

The upper right table shows a circuit breaker operation state data measured by a sensor in a circuit breaker. In the table, a data column represents that a measured data type is a circuit breaker state, a sensing time column represents a time at which the data is measured, and a value column represents a circuit breaker state at a corresponding measurement time. In this case, referring to a third row 702, the circuit breaker state measured at 1:00:10 is ON.

The lower left table shows oil temperature data measured by a transformer oil temperature sensor. An oil temperature is the temperature of oil in a transformer. The oil temperature data is used as a criterion for actuating a fan needed for cooling and stops a system when too high.

In the table, a data column represents that a measured data type is the oil temperature, a sensing time column represents a time at which the oil temperature data is measured, and a value column represents the measurement value of the oil temperature at a corresponding measurement time. In this case, referring to a seventh row 703, the oil temperature value measured at 1:00:10 is 322.

The lower right table shows voltage data measured by a voltage sensor. In the table, a data column represents that a measured data type is a voltage, a sensing time column represents a time at which the voltage data is measured, and a value column represents the measurement value of the voltage at a corresponding measurement time. In this case, referring to a third row 704, the voltage value measured at 1:00:10 is 199.

Pieces of data shown in the tables may be used for a control operation in the HVDC system. In this case, pieces of measurement data may be stored in the form of DB in FIG. 6. In an embodiment, the pieces of measurement data may be stored in a data server in the controller of the HVDC system.

A plurality of sub systems and controllers that is included in the HVDC system does not have the same execute cycle. Thus, in order to use data having the same measurement time, time information is checked and aggregated. In particular, it is possible to select pieces of data 701 to 704 having the same sensing time in each of the tables and use them for a control operation. For example, a system that performs an operation at 1:00:15 may use data measured at the same time 1:00:10 for an operation to increase the accuracy of control.

FIG. 8 shows a data measurement method in an HVDC system according to an embodiment.

The HVDC system measures pieces of power related data in step S801. According to an embodiment, the pieces of power related data may include measurement values for an AC current, an AC voltage, a DC current, and a DC voltage.

The HVDC system determines measurement times at which the pieces of power related data are measured, respectively in step S802. According to an embodiment, the HVDC system may tag information on the measurement time to each of the pieces of power related data. According to another embodiment, the HVDC system may determine respective measurement times from information on the measurement times tagged to the pieces of power related data.

The HVDC system performs control based on power related data having the same measurement time among the pieces of power related data in step S803.

FIG. 9 shows a data measurement method in an HVDC system according to another embodiment.

The HVDC system measures pieces of power related data in step S901.

The HVDC system determines measurement times at which the pieces of power related data are measured, respectively in step S902.

The HVDC system determines whether there is power related data that may not tag the measurement time, in step S903.

If there is the power related data that may not tag the measurement time (Yes in step S903), the HVDC system predicts the measurement time from a time at which corresponding power related data is converted into control operation data in step S904.

On the other hand, if there is no power related data that may not tag the measurement time (No in step S903), the HVDC system performs control based on power related data having the same measurement time among the pieces of power related data in step S905.

According to embodiments, since an acquisition time at a sensor is tagged along with a measurement value and transmitted to a control system or upper system, it is possible to enhance the reliability and accuracy of control as an operation result by the using input data having synchronized measurement times if possible in operation. Also, it is possible to perform the accurate state and situation determination of a system and power system at an accident time or in a specific situation by the using of time information tagged with obtained data.

Further, the reliability of control is enhanced because it is not only possible to obtain an accurate snap shot on the current power system based on data synchronized by artificial satellite but also it is possible to have more excellent accuracy than the typical case where an operation is performed based on measurement data.

While embodiments have been mainly described above, they are only examples and do not limit the present disclosure and a person skilled in the art to which the present disclosure pertains could appreciate that it is possible to implement many variations and applications not illustrated above without departing from the essential characteristics of the embodiments. For example, components particularly represented in the embodiments may vary. In addition, the differences related to such variations and applications should be construed as being included in the scope of the present disclosure that the following claims define.

What is claimed is:

1. A data measurement device in a high voltage direct current (HVDC) system, the data measurement device comprising:
a power measurement unit configured to measure pieces of power related data;
a signal transmission and conversion unit configured to convert the pieces of power related data into control operation data for performing a control of an operation of the HVDC system, and transmit the control operation data to a control unit; and
the control unit configured to determine measurement times at which the pieces of power related data are measured respectively, and to perform a control based on pieces of power related data having a same measurement time among the pieces of power related data,
wherein the control unit is further configured to:
obtain an actual measurement time when a measured measurement time is tagged to each of the pieces of power related data;
predict a predicted measurement time based on an acquisition time of a passive sensor by subtracting a previously measured time consumed for signal transmission and conversion of the pieces of power related data from a time at which conversion into the control operation data is completed, when the measured measurement time is not tagged to each of the pieces of power related data; and
assign, as the measurement time, the actual measurement time when a measured measurement time is tagged or the predicted measurement time when the measured measurement time is not tagged.

2. The data measurement device according to claim 1, wherein the control performed by the control unit comprises at least one of operation control of a switching device comprising a circuit breaker, power control increasing or decreasing an amount of transmission power, and voltage control controlling DC and AC voltages.

3. The data measurement device according to claim 1, wherein the control unit controls the power measurement unit to enable information on the measurement time to be tagged to each of the pieces of power related data.

4. The data measurement device according to claim 1, further comprising a memory unit that stores the pieces of power related data in association with the measurement time.

5. The data measurement device according to claim 1, wherein the pieces of power related data comprises at least one of measurement values for an alternating current (AC) current, an AC voltage, a DC current, a DC voltage, a circuit breaker state, and a TAP position.

6. The data measurement device according to claim 1, wherein the power measurement unit comprises:
- an AC measurement unit measuring AC power that comprises an AC current and an AC voltage; and
- a DC measurement unit measuring DC power that comprises a DC current and a DC voltage.

7. The data measurement device according to claim 1, wherein the power measurement unit comprises a global positioning system (GPS) signal reception unit that receives a GPS signal, and determines the measurement time based on the GPS signal received by the GPS signal reception unit.

8. A data measurement method in a high voltage direct current (HVDC) system, the data measurement method comprising:
- measuring pieces of power related data;
- converting the pieces of power related data into control operation data for performing a control of an operation of the HVDC system;
- transmitting the control operation data to a control unit;
- determining measurement times at which the pieces of power related data are measured respectively;
- obtaining an actual measurement time when a measured measurement time is tagged to each of the pieces of power related data,
- predicting a predicted measurement time based on an acquisition time of a passive sensor by subtracting a previously measured time consumed for signal transmission and conversion of the pieces of power related data from a time at which conversion into the control operation data is completed, when the measured measurement time is not tagged to each of the pieces of power related data;
- assigning, as the measurement time, the actual measurement time when a measured measurement time is tagged or the predicted measurement time when the measured measurement time is not tagged; and
- performing control based on pieces of power related data having a same measurement time among the pieces of power related data.

9. The data measurement method according to claim 8, wherein the control comprises at least one of operation control of a switching device comprising a circuit breaker, power control increasing or decreasing an amount of transmission power, and voltage control controlling DC and AC voltages.

10. The data measurement method according to claim 8, wherein information on the measurement time is tagged to each of the pieces of power related data.

* * * * *